(12) United States Patent
Popovic et al.

(10) Patent No.: US 7,235,968 B2
(45) Date of Patent: Jun. 26, 2007

(54) SENSOR FOR DETECTING THE DIRECTION OF A MAGNETIC FIELD IN A PLANE

(75) Inventors: Radivoje Popovic, St-Sulpice (CH); Christian Schott, Lussy-sur-Morges (CH)

(73) Assignee: Melexis Technologies SA, Bevaix (CH)

( * ) Notice: Subject to any disclaimer, the term of this patent is extended or adjusted under 35 U.S.C. 154(b) by 0 days.

(21) Appl. No.: 10/569,146

(22) PCT Filed: Aug. 22, 2003

(86) PCT No.: PCT/EP03/10503

§ 371 (c)(1),
(2), (4) Date: Feb. 21, 2006

(87) PCT Pub. No.: WO2005/029106

PCT Pub. Date: Mar. 31, 2005

(65) Prior Publication Data

US 2007/0029998 A1    Feb. 8, 2007

(51) Int. Cl.
G01R 33/02 (2006.01)
G01R 33/00 (2006.01)
(52) U.S. Cl. ...................... 324/247; 324/260
(58) Field of Classification Search .......... 324/244, 324/246–247, 260
See application file for complete search history.

(56) References Cited

U.S. PATENT DOCUMENTS 4,599,564 A    7/1986  Kelleher et al. ............ 324/251
6,545,462 B2   4/2003  Schott et al. ............ 324/207.2

FOREIGN PATENT DOCUMENTS

EP    1 182 461 A2    2/2002
WO    WO 01/18556 A1  3/2001

OTHER PUBLICATIONS

Popovic, R.S., "Not-plate-like Hall magnetic sensors and their applications" Sensors and Actuators A, Elsevier Sequoia S.A., Lausanne, CH, vol. 85, No. 1-3, Aug. 25, 2000, pp. 9-17, XP004214441, ISSN: 0924-4247.

Primary Examiner—Bot LeDynh
(74) Attorney, Agent, or Firm—McCormick, Paulding & Huber LLP (57) ABSTRACT

The invention relates to a sensor for detecting the direction of a magnetic field in a plane whose direction can be defined by the indication of a polar angle ?. Said sensor comprises a number of n magnetic field sensors (3.0 to 3.7). A measurement axis (8.1 to 8.4) is assigned to each magnetic field sensor in such a manner that the absolute value of the output signal of the magnetic field sensor is largest when the magnetic field runs parallel to the measuring axis. All measuring axes intersect at a common point (5). The number k of measuring axes is equal to at least three. An operating mode is provided during which two magnetic field sensors are selected for calculating the angle ?. These two magnetic field sensors belong to different measuring axes, and the values of the output signals thereof are less than those of the output signals of the magnetic field sensors belonging to the other measuring axes.

15 Claims, 2 Drawing Sheets

SENSOR FOR DETECTING THE DIRECTION OF A MAGNETIC FIELD IN A PLANE

CROSS REFERENCE TO RELATED APPLICATION

The present application is related to and claims priority of the PCT application number PCT/EP03/10503 entitled Sensor for detecting the direction of a magnetic field in a plane, filed Aug. 22, 2003, the disdosure of which is herein incorporated by reference.

FIELD OF THE INVENTION

The invention concerns a sensor for detecting the direction of a magnetic field in a plane.

BACKGROUND OF THE INVENTION

Such sensors are suitable for example for measuring the direction of a magnetic field in a plane. Nowadays, sensors are almost exclusively used that measure the components of the magnetic field in relation to two orthogonal coordinate axes. These sensors contain magnetic field sensors such as magnetoresistive components (e.g. Philips KMZ41) or Hall elements (e.g. Sentron 2SA-10). The magnetic field sensors provide two analogue output voltages that are proportional to the sine or cosine function of the direction of the magnetic field. The direction of the magnetic field can be determined from these two output voltages. To do so, on the one hand the quadrant of the field direction has to be determined from the sign of the two output voltages and, on the other hand the arc tangent of the quotients of both output voltages has to be calculated. As an accurate analogue quotient formation is very complex to implement, the quotient formation is often done in a digital way for example by means of the iterative CORDIC algorithm. The digital quotient formation is time-consuming and therefore slow. Furthermore, to carry out these calculations, the sensor must have a microcontroller. Such a sensor is therefore large, expensive and slow.

A sensor of this type is used for example in an angle transmitter in order to measure the direction of a magnetic field produced by a permanent magnet. Here, a further problem exists in that the strength of the magnetic field produced by the permanent magnet is greatly dependent on the temperature of the permanent magnet. This necessitates a large measuring range of the sensor. For sensors that have a ferromagnetic core for the passive amplification of the magnetic field, the danger exists that the magnetic field saturates the ferromagnetic core or at least partially saturates it, which leads to measurement errors.

A sensor suitable for determining the direction of a two-dimensional magnetic field is Known from EP 1182461. The sensor comprises a magnetic field concentrator with a flat shape and two magnetic field sensors that comprise at least one Hall element whereby the Hall elements are arranged in the area of the edge of the magnetic field concentrator. The first magnetic field sensor measures a first component of the magnetic field and the second magnetic field sensor measures a second component of the magnetic field. The direction of the magnetic field can therefore be determined from the signals of the two magnetic field sensors.

The object of the invention is to develop a sensor with which the direction of the external magnetic field in a plane can be determined in a simple manner.

BRIEF DESCRIPTION OF THE INVENTION

A sensor in accordance with the invention comprises a semiconductor chip with at least three magnetic field sensors, logic, amplifier and evaluation circuits. The amplitudes of the output signals of the magnetic field sensors are dependent on the direction of the external magnetic field. Hall elements integrated into the semiconductor chip are preferably used as magnetic field sensors however magnetoresistive or other magnetic field sensitive sensors can also be used. In a preferred embodiment, a flat ring-shaped or disc-shaped magnetic field concentrator made of ferromagnetic material is applied to the surface of the semiconductor chip. The sensor serves to determine the direction of an external magnetic field in the plane defined by the surface of the semiconductor chip or the flat magnetic field concentrator. The direction of the magnetic field in this plane can be characterised by a polar angle $\phi$. The sensor is characterised by a number k of at least three measuring axes that intersect at a common point. The measuring axes are each defined by a polar angle whereby the angle $\psi$ of the measuring axis with the number m is given by $$\Psi_m = m \frac{180°}{k}.$$

For a sensor with k=3 measuring axes, the angles $\Psi_0=0°$, $\Psi_1=60°$, and $\Psi_2=120°$ result. For a sensor with k=4 measuring axes, the angles $\Psi_0=0°$, $\Psi_1=45°$, $\Psi_2=90°$ and $\Psi_3=135°$ result. At least one magnetic field sensor is assigned to each measuring axis. Assignment of a magnetic field sensor to a measuring axis is defined so that the output signal of the magnetic field sensor achieves always then a maximum when the external magnetic field runs parallel to its measuring axis.

The measuring axes divide the plane into different sectors bordering onto one another. The number of sectors is twice as large as the number of measuring axes. The direction of the magnetic field to be measured always falls within one of the sectors. However, the sector within which the magnetic field falls is not used for measurement but one of the two sectors in which a zero crossing line falls that runs perpendicular to the magnetic field. In this selected sector it is possible to replace trigonometric functions such as Sin(x) and Tan(x) or their inverse functions Arcsin(x) and Arctan(x) with the argument x without the accuracy of the measurement result being too greatly reduced and therefore, with the fundamental arithmetic operations subtraction, addition, division and multiplication, to calculate the angle $\phi$ from the output signals of those magnetic field sensors that lie on the measuring axes bordering the selected sector. The sector to be selected can be characterised in different ways, on the one hand, in terms of absolute value the output signals of the magnetic field sensors that lie on the measuring axis bordering it are smaller than the output signals of the magnetic field sensors that lie on the other measuring axes. On the other hand, the output signals of these selected magnetic field sensors have different signs provided that a specific order is maintained in the arrangement and wiring of the magnetic field sensors.

The output signals delivered by the magnetic field sensors lie on a sine curve, i.e. the output signals of the magnetic field sensors are proportional to the sine of their polar angle $\sin(\Psi_m)$. The selected magnetic field sensors are located on both sides of a zero crossing of the sine curve. In the area of the zero crossings, the sine curve is almost linear so that the angle φ can be determined with sufficient accuracy from the output signals of the magnetic field sensors lying on both sides of a zero crossing by means of linear interpolation.

The accuracy of the angle φ determination can be increased when the value of the angle φ determined from the output signals of the magnetic field sensor is corrected by means of a characteristic curve. The characteristic curve is preferably available in the form of a table whereby each value determined from the output signals is assigned to the corresponding corrected value.

It is practical to provide two magnetic field sensors in pairs per measuring axis. Their output signals are equal in terms of absolute value but differ in the sign. Because their output signals only differ with the sign, one of the two magnetic field sensors can be fictitious, i.e. it is not physically present but its output signal is derived from the output signal of the other magnetic field sensor. This version enables simple wiring and evaluation without having to inverse one or both signs of the output signals of the established neighbouring magnetic field sensors for evaluation.

The sensor can be formed with or without magnetic field concentrator. If the sensor is formed without magnetic field concentrator, then the magnetic field sensors have to be sensitive to a magnetic field that is aligned parallel to the surface of the semiconductor chip. The magnetic field sensors that belong to different measuring axes differ in their alignment in the semiconductor chip. For many applications, their position on the semiconductor chip is unimportant. If the sensor has a flat ring-shaped or disc-shaped magnetic field concentrator, then the magnetic field sensors should be arranged along the edge of the magnetic field concentrator where the field strength of the magnetic field is greatest.

BRIEF DESCRIPTION OF THE DRAWINGS

In the following, embodiments of the invention are explained in more detail based on the drawing.

DETAILED DESCRIPTION OF THE INVENTION

Figure 1:
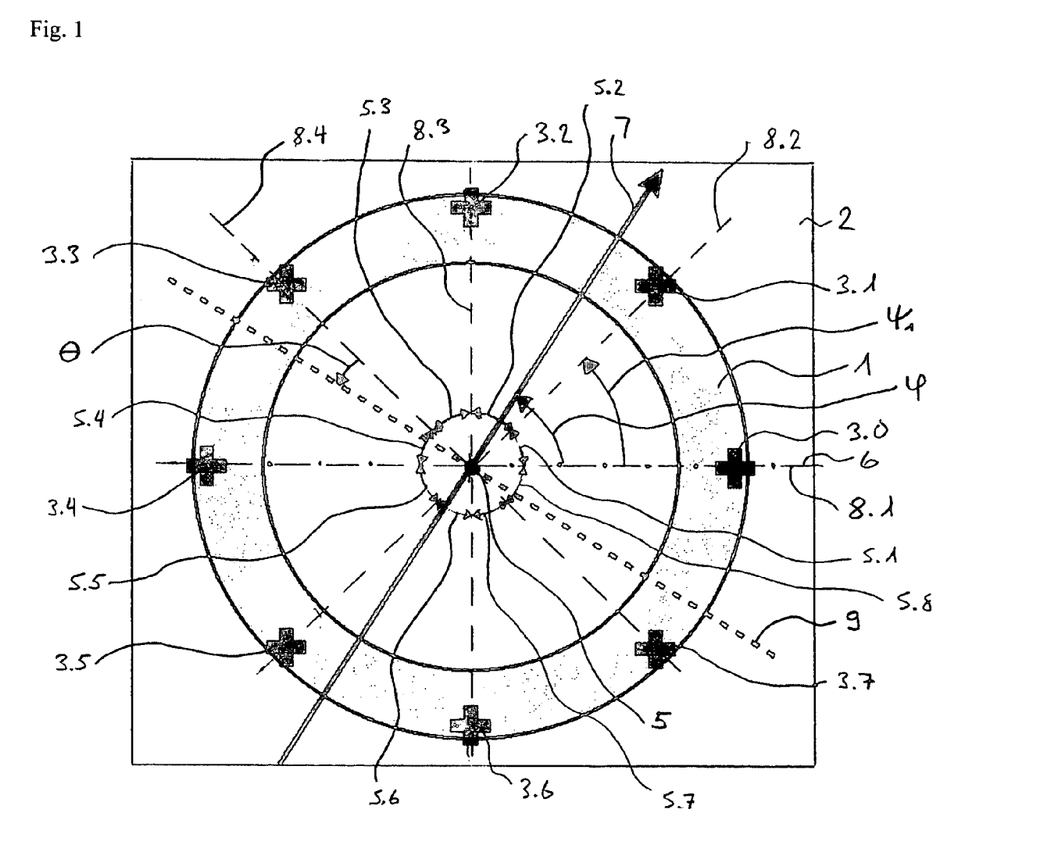
FIG. 1 shows a plan view of a first sensor with a magnetic field concentrator and with eight magnetic field sensors.
Figure 2:
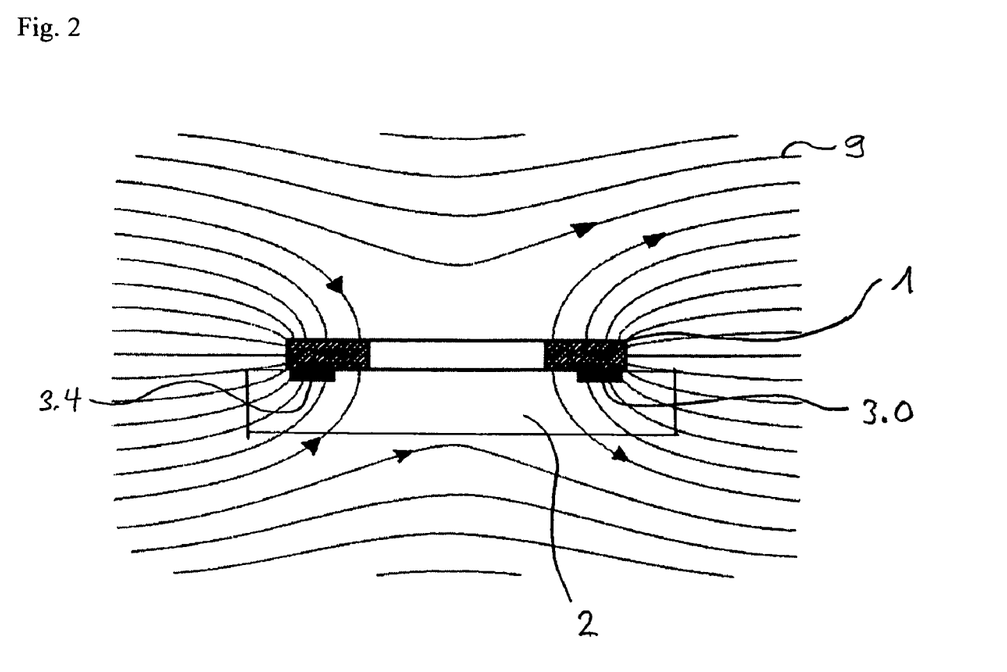
FIG. 2 shows a cross-section of the sensor.

FIG. 1 shows a plan view of a sensor in accordance with the invention in a preferred embodiment with a magnetic field concentrator 1. The sensor consists of a semiconductor chip 2 with the flat ring-shaped or disc-shaped magnetic field concentrator 1 arranged on its upper side and a number of n magnetic field sensors 3.$m$, whereby the index m assumes the values of 0 to n−1, as well as logic, amplifier and evaluation circuits. The number n of the magnetic field sensors is preferably an integral power of the number 2. In the example, n=$2^3$=8. If the magnetic field concentrator 1 is disc-shaped, then it preferably has a uniform thickness. However, in the middle it can be formed thicker than at the edge 4. The magnetic field concentrator 1 therefore works as a concentrator for the two components of the magnetic field that lie in the plane designated as xy plane formed by it. The magnetic field sensors 3.0 to 3.(n−1) are arranged at regular angular distances along the edge 4 of the magnetic field concentrator 1 (along the outer edge 4 with a ring-shaped magnetic field concentrator 1) because there the field strength is greatest as can be seen in FIG. 2. The magnetic field sensors 3.0 to 3.(n−1) are numbered in turn from 0 to n−1 in anti-clockwise direction. The position of the magnetic field sensors 3.0 to 3.(n−1) is preferably given in polar coordinates (r, ψ), whereby the radius r is the same for all magnetic field sensors 3.0 to 3.(n−1) and the angle $\psi_m$ assigned to the magnetic field sensor 3.$m$ is given by $\psi_m$=m*360°/n. The direction of the external magnetic field in the plane formed by the magnetic field concentrator is fully defined by specification of a polar angle φ. The origin 5 of the polar coordinate system and the centre of the first magnetic field sensor 3.0 define an axis designated as polar axis 6. The angle φ designates the angle embraced by the magnetic field and the polar axis 6. In FIG. 1, an arrow 7 indicates the direction of the magnetic field to be measured in the plane formed by the magnetic field concentrator 1. The arrow 7 can point in any direction, in the example the arrow 7 embraces an angle of around 60° with the polar axis 6. A soft magnetic material such as Vitrovac 6025Z is preferably selected as material for the ferromagnetic magnetic field concentrator. The output signal delivered by the magnetic field sensor 3.$m$ in measuring operation is designated as $U_m$.

The n magnetic field sensors define a number of k=n/2 measuring axes 8.1 to 8.4, i.e. with this example two magnetic field sensors are assigned to each measuring axis. The measuring axes 8.1 to 8.4 intersect at the origin 5 of the polar coordinate system. The measuring axes 8.1 to 8.4 border n sectors S.1 to S.n, that are numbered from 1 to n. Two magnetic field sensors that lie on neighbouring measuring axes are assigned to each sector. The magnetic field sensors 3.(m−1) and 3.$m$ are assigned to the sector S.m. The polar axis 6 and the measuring axis 8.1 coincide.

FIG. 2 shows the course of the field lines 9 of the external magnetic field. The spatial direction running orthogonal to the xy plane is designated as z direction. The field lines at the location of the two magnetic field sensors 3.0 and 3.4 point in different z directions as the magnetic field enters the magnetic field concentrator 1 at the location of one magnetic field sensor, here the magnetic field sensor 3.4, and leaves it at the location of the other magnetic field sensor 3.0 lying opposite. The relative permeability of the material of the magnetic field concentrator 1 is greater than 1000 while the relative permeability of air and of the semiconductor chip 2 amounts to around 1. The field lines are therefore practically always aligned perpendicular to the surface of the magnetic field concentrator 1. Hall elements integrated into the semiconductor chip 2 are preferably used as magnetic field sensors however magnetoresistive or other magnetic field sensitive sensors can also be used. In the example in FIG. 1 the magnetic field sensors are so-called horizontal Hall elements. If the magnetic field sensors are sensitive to a magnetic field that runs orthogonal to the surface of the semiconductor chip 2, as for example the horizontal Hall elements, then the magnetic field sensors should be arranged underneath the edge 4 of the magnetic field concentrator 1. If the magnetic field sensors are sensitive to a magnetic field that runs parallel to the surface of the semiconductor chip 2, as for example so-called vertical Hall elements, then the magnetic field sensors should be arranged outside the edge 4 and in tangential orientation to the edge 4 of the magnetic field concentrator 1.

Further details on the structure of such a sensor can be taken from U.S. Pat. No. 6,545,462. The international patent application PCT/EP03/50342 describes a method for the optimum operation of such a sensor with which the magnetic field concentrator is magnetised with a predefined magnetisation by means of an additional coil.

For the following explanations reference is again made to FIG. 1. A line intersecting the origin 5 of the polar coordinate system and running perpendicular to the direction of the magnetic field is designated as zero crossing line 10. The zero crossing line 10 separates those magnetic field sensors that carry a positive output signal from those magnetic field sensors that carry a negative output signal.

In the example, the angle φ between the polar axis 6 and the external magnetic field amounts to around 60°. This has the result that in this example the magnetic field sensors 3.0 to 3.3 carry a positive output signal while the magnetic field sensors 3.4 to 3.7 carry a negative output signal. The zero crossing line 10 therefore runs between the magnetic field sensors 3.3 and 3.4 or also 3.7 and 3.0.

It will now be described how the direction of the external magnetic field, i.e. the angle φ, is determined. To determine the angle φ in accordance with the invention the two neighbouring magnetic field sensors are first determined for which the sign of their output signals differs. The angle φ is then calculated from the position of these two magnetic field sensors and their output signals. The logic, amplifier and evaluation circuits serve to operate the magnetic field sensors corresponding to the method in accordance with the invention and to amplify and evaluate their output signals as well as for other tasks such as the magnetisation of the ring-shaped magnetic field concentrator 1 in accordance with the theory of the previously quoted international patent application PCT/EP03/50342. The method in accordance with the invention comprises the following steps:

a) Determining the two neighbouring magnetic field sensors between which the sign of the output signals changes from a positive value to a negative value. This can be done for example in this way: Starting with the first magnetic field sensor 3.0 in ascending order, at first the first magnetic field sensor is determined the output signal of which is positive. The number of this magnetic field sensor is designated with the letter k. Consequently, its output signal is $U_k$. In the example, k=1. Then, the first magnetic field sensor is determined the output signal of which is negative. The number of this magnetic field sensor is designated with the letter p. Consequently, its output signal is $U_p$. In the example, p=4. Changing the sign of the output signal therefore takes place between the two neighbouring magnetic field sensors 3.(p−1) and 3.p, in the example, between the two magnetic field sensors 3.3 and 3.4. The sector to be used for the measurement is therefore determined: These two magnetic field sensors 3.(p−1) and 3.p belong to sector S.p. Furthermore, in terms of absloute value, the output signals of these two magnetic field sensors 3.(p−1) and 3.p are smaller than the output signals of the magnetic field sensors that lie on other measuring axes.

b) Determining the angle θ, encompassed by the zero crossing line 10 and the measuring axis running through the magnetic field sensor 3.(p−1), from the output voltages $U_{p-1}$ and $U_p$. The angle θ is given by the equation $$\Theta = \frac{360°}{n} \frac{\text{Arcsin}(U_{p-1})}{\text{Arcsin}(U_{p-1}) - \text{Arcsin}(U_p)}. \quad (1)$$

The invention now makes use of the fact that, for small values of x, in a good approximation sin(x)=x and therefore also inversely x=Arcsin(x) are valid. The equation (1) can therefore be approximated in a good approximation by means of the equation $$\Theta = \frac{360°}{n} \frac{U_{p-1}}{U_{p-1} - U_p} \quad (2)$$

This equation (2) corresponds to a linear interpolation between the measured values of neighbouring magnetic field sensors arranged at an angular distance of 360°/n. In the example in FIG. 1 one gets $$\Theta = \frac{360°}{n} \frac{U_3}{U_3 - U_4} \quad (3)$$

With the equation (1), the measured output signals $U_{p-1}$ and $U_p$ have to be scaled because, in any case, they have to be less than the number 1 as otherwise the arc sine is not defined. With the equation (2), the necessity for scaling is omitted because of the ratio formation. The calculation of the arc sine function in equation (1) is complicated and time-consuming. With equation (2), a subtraction and a division of the output signals from two magnetic field sensors are sufficient in order to calculate the angle θ.

The maximum error of the angle φ determined in this way is dependent on the number n of the magnetic field sensors as well as on the approximation formula used for determining the angle φ from the output voltages $U_{p-1}$ and $U_p$. With use of the equation (2), the maximum error is smaller than around 1.1° with n=6 magnetic field sensors, smaller than around 0.45° with n=8 magnetic field sensors and smaller than around 0.14° with n=12 magnetic field sensors.

c) Calculation of the angle φ to $$\varphi = \Psi_{p-1-\frac{n}{4}} + \Theta = \left[(p-1) - \frac{n}{4}\right]\frac{360°}{n} + \Theta. \quad (4)$$

In the example in FIG. 1, results in φ=45°+Θ).

The ratio $$\frac{U_{p-1}}{U_{p-1} - U_p}$$

in equation (2) can be determined in a simple way by means of an A/D converter in that the value of the numerator, $U_{p-1}$, is applied to the signal input and the value of the denominator, $U_{p-1}-U_p$, to the reference input of the A/D converter. The number at the output of the A/D converter is then equal to the ratio $$\frac{U_{p-1}}{U_{p-1} - U_p}.$$

If the number n of the magnetic field sensors is an integral power of the number 2, then the angle φ can be presented by means of a binary number the "most significant bits" of which represent the number (p−1) and the "least significant bits" of which represent the number delivered by the A/D converter. With a number of n=8 magnetic field sensors, an accuracy adapted with the maximum error given by means of application of the approximation formula can already be achieved with a 6-Bit A/D converter. It should be noted that in the given equations the indices that designate a specific magnetic field sensor are always to be used modulo of the number n of the magnetic field sensors.

The ratio $$\frac{U_{p-1}}{U_{p-1} - U_p}$$

can also be formed with an analogue circuit. From the equation $$\frac{U_{p-1}}{U_{p-1} - U_p} = \frac{u}{r}, \quad (5)$$

whereby the number u is the required digital number that gives the ratio $$\frac{U_{p-1}}{U_{p-1} - U_p}$$

in units of a fixed number r, by transforming the equations one gets $$(r-u)*U_{p-1} + u*U_p = 0, \text{ or} \quad (6)$$

$$(r-u)*I_{p-1} + u*I_p = 0, \quad (7)$$

whereby $I_{p-1}$ and $I_p$ are currents proportional to the output signals $U_{p-1}$ and $U_p$. The equation (7) can be solved by means of an analogue circuit that comprises a capacitor and a comparator and converted into a digital number. The currents $I_{p-1}$ and $I_p$ load and unload the capacitor in accordance with the following process:

1) The capacitor is loaded with current $I_{p-1}$ for a predetermined duration Δt.
2) r−1 cycles now follow in which the capacitor is loaded with the current $I_{p-1}$ for the duration Δt when, at the beginning of the cycle, the voltage at the capacitor was negative and in which the capacitor is unloaded with the current $I_p$ for the duration Δt when, at the beginning of the cycle, the voltage at the capacitor was positive. The comparator serves to determine the sign of the voltage at the capacitor at the beginning of the cycle. On carrying out these r cycles, the voltage at the capacitor increasingly approximates the voltage U=0. The number of unloading cycles is equal to the number u, the number of loading cycles is equal to the number (r−u).
3) The angle θ in units of $$\frac{360°}{n*r}$$

is then given by the number u of the unloading cycles in which the capacitor was unloaded with the current $I_{p-1}$.

The number r of the load and unload cycles of the capacitor as well as the number n of the magnetic field sensors determine the resolution. When the resolution should amount to 0.5° for example, then r=2*360/n load and unload cycles have to be carried out.

As a result of the approximation tan(x)=x, the angle θ determined with the method in accordance with the invention is subject to a systematic error. This systematic error can be eliminated with a characteristic curve. To do so, a table for example is additionally integrated into the semiconductor chip 2 as a ROM (read only memory) where the established number u is assigned to a number v. The number v corresponds to the correct value. After step b), it is therefore advantageous to correct the established ratio $$\frac{U_{p-1}}{U_{p-1} - U_p}$$

or the number established with the A/D converter or the number u established in accordance with the previously described method by means of the characteristic curve and in this way to obtain the angle θ corrected by the systematic error with greater accuracy.

This embodiment has several advantages. One advantage exists in that the magnetic field concentrator amplifies the magnetic field to be measured. A second advantage results from the fact that per measuring axis two magnetic field sensors are present the output signals of which have different signs. The advantage lies in that, on determining the angle φ, it doesn't matter whether the magnetic field points in the positive or negative direction of the measuring axis. If, as in the example presented, the angle φ amounts to 60°, then the two neighbouring magnetic field sensors 3.1 and 3.2 are used to determine the angle φ. If however the angle φ amounts to 60°+180°=240°, then the two neighbouring magnetic field sensors 3.5 and 3.6 are used to determine the angle φ. The angle φ could be calculated from the output signals of the two magnetic field sensors 3.1 and 3.2 however in this case their signs had to be reversed and 180° added to the calculated angle φ. This requires more effort and is more complicated.

Other versions of this embodiment are explained in the following.

Version 1

The position of the zero crossing line 10 results from the direction of the external magnetic field. Determining the two neighbouring magnetic field sensors in step a between which the sign of the output signals changes from a positive value to a negative value can therefore also be done in that firstly the two neighbouring magnetic field sensors are established the output signals of which have the two largest values. In the example in FIG. 1 these are the two magnetic field sensors 3.1 and 3.2. If their output voltages are designated $U_k$ and $U_{k+1}$, then the two neighbouring magnetic field sensors between which the sign of the output signals changes have the numbers k+n/4 and k+1+n/4.

Version 2

For applications with which the direction of the external magnetic field does not change erratically, step a can be omitted for following measurements as long as the signs of the two output signals $U_{p-1}$ and $U_p$ do not change.

Version 3

Determining the direction of the external magnetic field in the xy plane formed by the magnetic field concentrator 1 is also possible when half of the magnetic field sensors, namely the magnetic field sensors with the numbers $$\frac{n}{2}, \frac{n}{2}+1, \ldots, n$$

are omitted. The reason lies in that with the embodiment in accordance with FIG. 1, two magnetic field sensors are present per measuring axis that deliver the same information. The simplest possibility of determining the angle φ is to introduce the omitted magnetic field sensors again as fictitious magnetic field sensors whereby the output signal $U_{n/2+r}$ of the fictitious magnetic field sensor with the number n/2+r is set equal to the output signal of the magnetic field sensor with the number r but with reversed sign: $U_{n/2+r}=-U_r$. A fictitious magnetic field sensor is therefore a magnetic field sensor that is not physically present however to which a polar angle and an output signal are assigned that are used for the evaluation. The evaluation can then be done as with the first embodiment. This solution saves having to analyse the value and the sign of the output signals and then determining which output signals with or without reversed sign are to be used for the evaluation.

The embodiments described up to now are suitable for applications with which a possible z component of the external magnetic field is insignificant or with which magnetic field sensors are used that are sensitive to a magnetic field running in the xy plane.

Version 4

Figure 3:
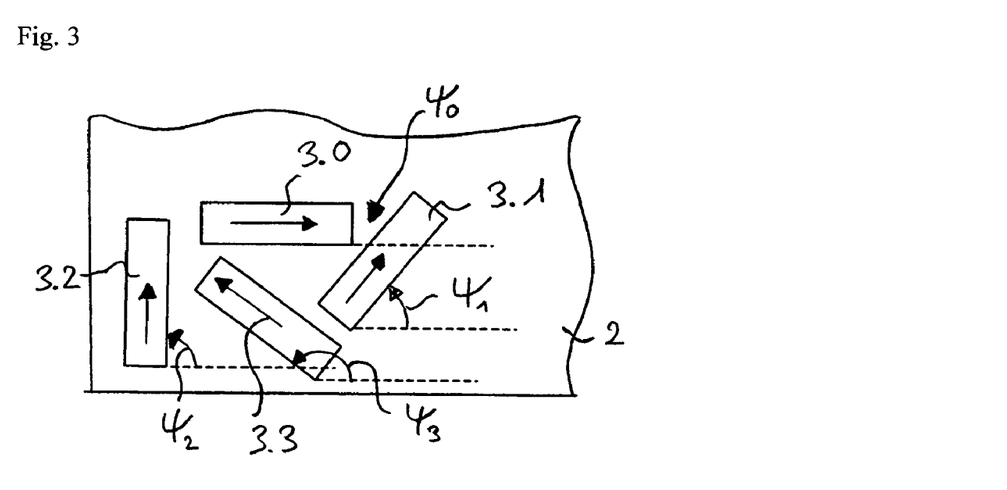
FIG. 3 shows a plan view of a second sensor without magnetic field concentrator and with four vertical Hall elements.

This version presented in FIG. 3 is derived from the preceding version 3. FIG. 3 again shows a plan view of the sensor. The sensor contains a number of k magnetic field sensors that are sensitive to a magnetic field that runs parallel to the surface of the semiconductor chip 2. The magnetic field sensors are for example vertical Hall elements the orientation of which differs. The sensor contains no magnetic field concentrator. Because no magnetic field concentrator is present, the magnetic field sensors can be arranged at any location on the semiconductor chip 2. The k magnetic field sensors are numbered as before but each orientated differently, namely in such a way that the output signal of the magnetic field sensor with the number m is at its maximum when the magnetic field points in the direction defined by the angle $$\Psi_m = m\frac{360°}{2k}.$$

For k=4 the angles $\Psi_0 0°$, $\Psi_1=45°$, $\Psi_2=90°$ and $\Psi_3=135°$ result. In FIG. 3, subsidiary lines and the angles $\Psi_0$, $\Psi_1$, $\Psi_2$ and $\Psi_3$ are included to illustrate the orientation of the magnetic field sensors 3.0 to 3.3. Whether two magnetic field sensors are "neighbouring" magnetic field sensors is not based on their location on the semiconductor chip 2 but on their orientation defined by means of the angle $\Psi_m$. As it is now established which magnetic field sensors are valid as "neighbouring", the direction of the magnetic field in the plane defined by the surface of the semiconductor chip 2 can be determined by means of the previously described method.

The magnetic field sensors can therefore be placed close together. It should also be noted that the direction of the current flowing through the vertical Hall elements is the same for all vertical Hall elements as a reversal of the current direction corresponds to a change in the angle from $\Psi_m$ to $\Psi_m+180°$. The current direction is represented in the four magnetic field sensors by means of an arrow. Such a magnetic field sensor can be used for example in an angle transmitter where the magnetic field sensor rotates on an axis relative to a magnet. In this case, it is useful to align the vertical Hall elements symmetrical to an axis running perpendicular to the surface of the semiconductor chip that, in the angle transmitter in the assembled state, coincides with the rotational axis of the angle transmitter.

If additionally, as with the preceding version 4, n/2 fictitious magnetic field sensors are introduced again and their output signals formed, then the evaluation can be done as with the first embodiment.

Version 5

This preferred version is suitable for applications with which the z component of the external magnetic field makes an undesirable contribution to the output signals of the magnetic field sensors. The number n of magnetic field sensors is an even number so that two magnetic field sensors lie opposite each other in pairs in relation to the origin 5 of the polar coordinate system. With opposite lying magnetic field sensors of a pair, the z component of the external magnetic field makes the same contribution to the output signals while, in terms of absolute value, the xy components of the external magnetic field make the same contributions to the output signals however with differing sign. The output signals of the two magnetic field sensors of a pair are therefore subtracted from each other, i.e. for calculation of the angle θ the equation $$\Theta = \frac{360°}{n} \frac{U_{p-1} - U_{p-1+\frac{n}{2}}}{\left(U_{p-1} - U_{p-1+\frac{n}{2}}\right)}, \quad (8)$$

is used instead of the equation (2) whereby the values $$p-1+\frac{n}{2} \text{ and } p+\frac{n}{2}$$

are always to be taken as modulo n. In the example in FIG. 1, one obtains $$\Theta = 45° \frac{U_3 - U_7}{(U_3 - U_7) - (U_4 - U_0)}, \quad (9)$$

because one has 8 modulo 8=0.

The sensor in accordance with the invention offers the advantage that determination of the direction of the magnetic field in the xy plane formed by the magnetic field concentrator 1 is possible without complicated arithmetical operations. Furthermore, the sensor can be expanded for operation in two different operating modes. In the first operating mode, the direction of the external magnetic field is determined in accordance with the previously described method when the largest of the output signals $U_0$ to $U_{n-1}$ exceeds a predetermined value $U_{lim}$. When the largest of the output signals $U_0$ to $U_{n-1}$ falls below the predetermined value $U_{lim}$, then the sensor works in a second operating mode in which the direction of the external magnetic field is determined in an analogue way based on the output signals of the two neighbouring magnetic field sensors the output signals of which are the greatest.

What is claimed is:

1. A method for detecting a direction of a magnetic field in a plane with a sensor comprising
   a number n of magnetic field sensors wherein a measuring axis is assigned to each magnetic field sensor in such a way that an absolute value of an output signal of the magnetic field sensor achieves a maximum when the magnetic field runs parallel to the measuring axis and wherein the number n of measuring axes amounts to at least three; the method comprising the steps of
   selecting two magnetic field sensors that belong to different measuring axes and the absolute values of the output signals of which are smaller than the output signals of the magnetic field sensors that belong to the other measuring axes; and
   determining the direction of the magnetic field in the plane from the output signals of the two selected magnetic field sensors.

2. The method according to claim 1, wherein the direction of the magnetic field in the plane is defined by an angle $\phi$, wherein an index m and an angle $$\Psi_m = m \frac{180°}{n}$$

are assigned to each magnetic field sensor, the index m running from 0 to n−1, wherein an absolute value of the output signal $U_m$ of the magnetic field sensor with index in achieves a maximum when the magnetic field runs parallel to the direction of its associated angle $\psi_m$, the method further comprising the steps of
   determining the indices of the two selected magnetic field sensors which indices are denoted as p−1 and p;
   determining an angle $\theta$ from the output signals $U_{p-1}$ and $U_p$ of the two selected magnetic field sensors; and
   calculating the angle $\phi$ to $\phi = \psi_{p-1} + \theta$.

3. The method according to claim 2, wherein the angle $\theta$ is determined as $$\theta = \frac{U_{p-1}}{U_{p-1} - U_p}.$$

4. The method according to claim 3, wherein the ratio $$\frac{U_{p-1}}{U_{p-1} - U_p}$$

is determined with an A/D converter, wherein the value $U_{p-1}$ is fed to a signal input of the A/D converter and the value $U_{p-1} - U_p$ to a reference input of the A/D converter.

5. The method according to claim 3, wherein the ratio $$\frac{U_{p-1}}{U_{p-1} - U_p}$$

is determined by loading a capacitor during a predetermined duration with a current that is proportional to the output signal $U_{p-1}$ followed by loading or unloading the capacitor in a predetermined number of cycles of the predetermined duration, wherein the sign of the voltage at the capacitor determines whether in the next cycle the capacitor is loaded with a current that is proportional to the output signal $U_{p-1}$ or unloaded with a current that is proportional to the output signal $U_p$.

6. The method according to claim 3, wherein two magnetic field sensors belong in pairs to a measuring axis and wherein the angle $\theta$ is determined as $$\theta = \frac{U_{p-1} - U_{p-1+\frac{n}{2}}}{\left(U_{p-1} - U_{p-1+\frac{n}{2}}\right) - \left(U_p - U_{p+\frac{n}{2}}\right)},$$

wherein the indices $$p-1+\frac{n}{2} \text{ and } p+\frac{n}{2}$$

are to be set modulo n.

7. The method according to claim 6, wherein the ratio $$\frac{U_{p-1} - U_{p-1+\frac{n}{2}}}{\left(U_{p-1} - U_{p-1+\frac{n}{2}}\right) - \left(U_p - U_{p+\frac{n}{2}}\right)}$$

is determined with an A/D) converter, wherein the value $$\left(U_{p-1} - U_{p-1+\frac{n}{2}}\right)$$

is fed to a signal input of the A/D converter and the value $$\left(U_{p-1} - U_{p-1+\frac{n}{2}}\right) - \left(U_p - U_{p+\frac{n}{3}}\right)$$

is fed to a reference input of the A/D converter.

8. The method according to claim 6, wherein the ratio $$\frac{U_{p-1} - U_{p-1+\frac{n}{2}}}{\left(U_{p-1} - U_{p-1+\frac{n}{2}}\right) - \left(U_p - U_{p+\frac{n}{2}}\right)},$$

is determined by loading a capacitor during a predetermined duration with a current that is proportional to $$U_p - U_{p+\frac{n}{2}}$$

followed by loading or unloading the capacitor in a predetermined number of cycles of a predetermined duration, wherein the sign of the voltage at the capacitor determines whether in the next cycle the capacitor is loaded with a current that is proportional to $$U_p - U_{p+\frac{n}{2}}$$

or unloaded with a current that is proportional to $$U_{p-1} - U_{p-1+\frac{n}{2}}.$$

9. The method according to claim 2, further comprising the step of correcting the angle θ by means of a characteristic curve.

10. The method according to claim 3, further comprising the step of correcting the angle θ by means of a characteristic curve.

11. The method according to claim 4, further comprising the step of correcting the angle θ by means of a characteristic curve.

12. The method according to claim 5, further comprising the step of correcting the angle θ by means of a characteristic curve.

13. The method according to claim 6, further comprising the step of correcting the angle θ by means of a characteristic curve.

14. The method according to claim 7, further comprising the step of correcting the angle θ by means of a characteristic curve.

15. The method according to claim 8, further comprising the step of correcting the angle θ by means of a characteristic curve.

* * * * *

UNITED STATES PATENT AND TRADEMARK OFFICE
CERTIFICATE OF CORRECTION

PATENT NO.       : 7,235,968 B2
APPLICATION NO.  : 10/569146
DATED            : June 26, 2007
INVENTOR(S)      : Radivoje Popovic et al.

It is certified that error appears in the above-identified patent and that said Letters Patent is hereby corrected as shown below:

Title Page, item [57]

In the Abstract, please delete the Abstract and substitute the following:

--A sensor for detecting the direction of a magnetic field in a plane, the direction of which is defined by a polar angle $\varphi$, has a number n of magnetic field sensors. A measuring axis is assigned to each magnetic field sensor in such a way that the absolute value of the output signal of the magnetic field sensor is at its greatest when the magnetic field runs parallel to the measuring axis. All measuring axes intersect at a common point. The number k of measuring axes amounts to at least three and an operating mode is foreseen with which for calculation of the angle $\varphi$ two magnetic field sensors are selected that belong to different measuring axes and the output signals of which in terms of value are less than the output signals of the magnetic field sensors that belong to other measuring axes.--.

In the Claims, Claim 2, Line 40, please delete the word "in" and replace it with the letter --m--.

In the Claims, Claim 7, Line 41, please delete the symbol ")" after the letters "A/D".

In the Claims, Claim 7, Line 50, please delete the symbol "$\frac{n}{3}$" and replace it with the symbol --$\frac{n}{2}$--.

UNITED STATES PATENT AND TRADEMARK OFFICE
CERTIFICATE OF CORRECTION

PATENT NO. : 7,235,968 B2
APPLICATION NO. : 10/569146
DATED : June 26, 2007
INVENTOR(S) : Radivoje Popovic et al.

It is certified that error appears in the above-identified patent and that said Letters Patent is hereby corrected as shown below:

In the Claims, Claim 8, Line 58, please delete the comma "," after the formula.

Signed and Sealed this

Twenty-first Day of August, 2007

JON W. DUDAS
*Director of the United States Patent and Trademark Office*